US009847752B2

(12) United States Patent
Rivaud et al.

(10) Patent No.: US 9,847,752 B2
(45) Date of Patent: Dec. 19, 2017

(54) MANUFACTURING AUTOMATION OF IN-SITU TEMPERATURE COMPENSATION INFORMATION

(71) Applicant: Ciena Corporation, Hanover, MD (US)

(72) Inventors: Daniel Rivaud, Ottawa (CA); Kevin Estabrooks, Nepean (CA)

(73) Assignee: Ciena Corporation, Hanover, MD (US)

( * ) Notice: Subject to any disclaimer, the term of this patent is extended or adjusted under 35 U.S.C. 154(b) by 31 days.

(21) Appl. No.: 15/071,562

(22) Filed: Mar. 16, 2016

(65) Prior Publication Data
US 2017/0272033 A1    Sep. 21, 2017

(51) Int. Cl.
| | | |
|---|---|---|
| *H03B 5/36* | (2006.01) | |
| *H03B 5/04* | (2006.01) | |
| *G01K 1/14* | (2006.01) | |
| *H03B 5/32* | (2006.01) | |
| *H03K 3/011* | (2006.01) | |
| *H03K 19/003* | (2006.01) | |

(Continued)

(52) U.S. Cl.
CPC .............. *H03B 5/04* (2013.01); *G01K 1/14* (2013.01); *G06F 1/20* (2013.01); *H01L 23/467* (2013.01); *H03B 5/32* (2013.01); *H03K 3/011* (2013.01); *H03K 19/00369* (2013.01)

(58) Field of Classification Search
CPC ...... H03B 5/04; H03B 5/1215; H03B 5/1228; H03B 5/1212; H03B 5/32; H03L 1/026; H03L 1/02; H03L 1/04; H03L 5/00; H03L 7/00; H03K 3/011; G01K 1/14; H01L 23/467; G06F 1/20

USPC ......... 331/158, 176; 713/324, 300; 361/697, 361/695, 679.49, 719
See application file for complete search history.

(56) References Cited

U.S. PATENT DOCUMENTS 6,823,031 B1   11/2004   Tatem
7,046,584 B2    5/2006   Sorrel's et al.
(Continued)

OTHER PUBLICATIONS

Haney, Mark A., "Design Technique for Analog Temperature Compensation of Crystal Oscillators," Thesis, Virginia Polytechnic Institute and State University, 2001, pp. 1-55.

*Primary Examiner* — Arnold Kinkead
(74) *Attorney, Agent, or Firm* — Clements Bernard Walker PLLC; Christopher L. Bernard; Lawrence A. Baratta, Jr.

(57) ABSTRACT

An in-situ temperature compensation method of an electronic device and an associated temperature sensor includes providing airflow from a vortex air gun to a board including the electronic device and the associated temperature sensor; determining an associated offset at various temperatures in an operating range; and creating and storing a calibration table in memory including the associated offsets at the various temperatures, the calibration table is used during operation of the electronic device for compensation due to temperature variation. A system includes a board, an electronic device disposed to the board; a temperature sensor disposed on the board; a processor disposed to the board and communicatively coupled to the electronic device and the temperature sensor; and instructions that cause the processor to determine an associated offset at various temperatures in an operating range, and create and store a calibration table in memory with the associated offsets at the various temperatures.

17 Claims, 6 Drawing Sheets

(51) Int. Cl.
*H01L 23/467* (2006.01)
*G06F 1/20* (2006.01)

(56) References Cited

U.S. PATENT DOCUMENTS

| | | | |
|---|---|---|---|
| 2006/0052970 A1* | 3/2006 | Arabi | G06F 1/206 702/132 |
| 2007/0236301 A1* | 10/2007 | Mayder | H03K 3/011 331/158 |
| 2008/0224786 A1 | 9/2008 | Stolpman et al. | |

* cited by examiner

MANUFACTURING AUTOMATION OF IN-SITU TEMPERATURE COMPENSATION INFORMATION

FIELD OF THE DISCLOSURE

The present disclosure generally relates to manufacturing automation systems and methods. More particularly, the present disclosure relates to manufacturing automation of in-situ temperature compensation information of electrical components.

BACKGROUND OF THE DISCLOSURE

Some electronic components such as Oven-Controlled Crystal Oscillator (OCXO) have performance variation with temperature. Such electronic components have to be characterized in manufacturing to determine how each particular device varies with temperature for calibration. This characterization is used to derive a calibration table to operate the electronic components at varying temperatures. One existing solution to OCXO temperature variation is to use a more expensive oscillator, such as using Rubidium. However, such approaches are impractical due to the significant cost increase. Thus, conventional approaches rely on temperature characterization in manufacturing to determine each device's individual calibration table. For example, oscillator vendors put a large number of oscillator devices into a temperature chamber and characterize the frequency response over temperature. In some cases, vendors produce devices that are internally temperature compensated (e.g., Temperature Compensated Crystal Oscillators (TCXOs)), but this requires a Phase Lock Loop (PLL) synthesizer and a processor included in the oscillator device; of course, this adds significant cost and is thus not common. Thus, in typical operation, temperature varying electronic components are characterized in temperature chambers in a manufacturing facility. Such processes are complex, time-consuming, and require large chambers which consume power and space.

It would be advantageous to provide manufacturing automation of in-situ temperature compensation information of electrical components.

BRIEF SUMMARY OF THE DISCLOSURE

In an exemplary embodiment, an in-situ temperature compensation method of an electronic device and an associated temperature sensor includes providing airflow from a vortex air gun to a board including the electronic device and the associated temperature sensor; determining an associated offset at various temperatures in an operating range; and creating and storing a calibration table in memory including the associated offsets at the various temperatures, wherein the calibration table is used during operation of the electronic device for compensation due to temperature variation. The airflow from the vortex air gun can be controlled to cause temperatures to the electronic device over the operating range. The airflow can be provided in a similar manner as airflow cooling the board during operation thereby matching temperature gradients experienced during the operation. The associated offset can be measured with reference to a stable frequency reference and the various temperatures are measured by the associated temperature sensor. The associated offset can be measured with reference to a stable frequency reference and the various temperatures are measured by the associated temperature sensor, and wherein the calibration table can include a two-tuple of [offset, temperature] for every N degrees in the operating range, wherein N is an integer or real number. The electronic device can include one of an Oven-Controlled Crystal Oscillator (OCXO) and a Temperature Compensated Crystal Oscillator (TCXO), wherein the associated offset is measured with reference to a stable frequency reference can include one of an IEEE1588v2 grandmaster, Synchronous Ethernet (SyncE), and Global Positioning System (GPS) signal. The electronic device can include one a Field Programmable Gate Array (FPGA), a buffer, and a driver. The determining, the creating, and the storing steps can be performed by a processor communicatively coupled to and controlling the vortex air gun.

In another exemplary embodiment, an in-situ temperature compensation system for an electronic device and an associated temperature sensor includes a vortex air gun mechanically positioned over a board and adapted to provide airflow over the board at a plurality of temperatures over an operating range; a processor communicatively coupled to the vortex air gun; and memory storing instructions that, when executed, cause the processor to cause airflow from the vortex air gun to the board, the electronic device, and the associated temperature sensor, determine an associated offset at various temperatures in an operating range, and create and store a calibration table in memory including the associated offsets at the various temperatures, wherein the calibration table is used during operation of the electronic device for compensation due to temperature variation. The airflow from the vortex air gun can be controlled to cause temperatures to the electronic device over the operating range. The airflow can be provided in a similar manner as airflow cooling the board during operation thereby matching temperature gradients experienced during the operation. The associated offset can be measured with reference to a stable frequency reference, and the various temperatures are measured by the associated temperature sensor. The associated offset can be measured with reference to a stable frequency reference, and the various temperatures are measured by the associated temperature sensor, and wherein the calibration table can include a two-tuple of [offset, temperature] for every N degrees in the operating range, wherein N is an integer or real number. The in-situ temperature compensation system of claim 9, wherein the electronic device can include one of an Oven-Controlled Crystal Oscillator (OCXO) and a Temperature Compensated Crystal Oscillator (TCXO), wherein the associated offset can be measured with reference to a stable frequency reference can include one of an IEEE1588v2 grandmaster, Synchronous Ethernet (SyncE), and Global Positioning System (GPS) signal. The electronic device can include one a Field Programmable Gate Array (FPGA), a buffer, and a driver.

In a further exemplary embodiment, an electronic system including an electronic device compensated by an in-situ temperature compensation system includes a board, wherein the electronic device is disposed on the board; a temperature sensor disposed on the board; a processor disposed on the board and communicatively coupled to the electronic device and the temperature sensor; and memory storing instructions that, when executed, cause the processor to determine an associated offset at various temperatures in an operating range, and create and store a calibration table in memory including the associated offsets at the various temperatures, wherein the calibration table is used during operation of the electronic device for compensation due to temperature variation. The memory storing instructions that, when executed, can further cause the processor to cause airflow from a vortex air gun to the board, the electronic device, and the temperature sensor to cause the various temperatures in the operating range. The associated offset can be measured with reference to a stable frequency reference, and the various temperatures can be measured by the associated temperature sensor. The associated offset can be measured with reference to a stable frequency reference, and the various temperatures are measured by the associated temperature sensor, and wherein the calibration table can include a two-tuple of [offset, temperature] for every N degrees in the operating range, wherein N is an integer or real number. The electronic device can include one of i) one of an Oven-Controlled Crystal Oscillator (OCXO) and a Temperature Compensated Crystal Oscillator (TCXO), wherein the associated offset is measured with reference to a stable frequency reference can include one of an IEEE1588v2 grandmaster, Synchronous Ethernet (SyncE), and Global Positioning System (GPS) signal; and ii) one a Field Programmable Gate Array (FPGA), a buffer, and a driver.

BRIEF DESCRIPTION OF THE DRAWINGS

The present disclosure is illustrated and described herein with reference to the various drawings, in which like reference numbers are used to denote like system components/ method steps, as appropriate, and in which.

DETAILED DESCRIPTION OF THE DISCLOSURE

Again, in various exemplary embodiments, the present disclosure relates to manufacturing automation systems and methods of in-situ temperature compensation information of electrical components. The systems and methods include a servo at manufacturing for building a unique temperature compensation table (calibration table). This reduces the need for expensive external equipment to measure frequency error and an interface to feed the results back to an onboard software table correlated with temperature. The systems and methods also include a vortex air gun rather than a heat chamber in the electronics manufacturing plant. These air guns are used for directed heated/cooled airflow for characterizing electronics based on temperature. The systems and methods can apply to a variety of temperature-sensitive devices, e.g., OCXOs, Field Programmable Gate Arrays (FPGAs), TCXOs, buffers, etc., that might drive a phase-sensitive output. Advantageously, the systems and methods enable in-situ characterization of electronic components with the exact same temperature sensor and position that will be used in the field. The temperature sensor is on the product and is part of what is being calibrated. Temperature sensors can easily have ±1° C. accuracy error or more. Thus, the in-situ characterization enables characterization of the electronic components as well as the temperature sensor, accurately and efficiently using the vortex air gun. In-situ characterization means the characterized device is surrounded by other components. Also, the vortex air gun can be used to replicate product fan airflow rate and direction. In another exemplary embodiment, devices that do not have temperature calibration for in the factory can learn their environment and correct for temperature. This is especially useful in Global Positioning System (GPS) assisted configurations where IEEE1588v2 is used as a backup reference, or a device enters holdover and the environmental temperature changes. IEEE1588v2 is Precision Time Protocol and is defined in IEEE1588v2 "Standard for a Precision Clock Synchronization Protocol for Networked Measurement and Control System" (2008), the contents of which are incorporated by reference.

Figure 1:
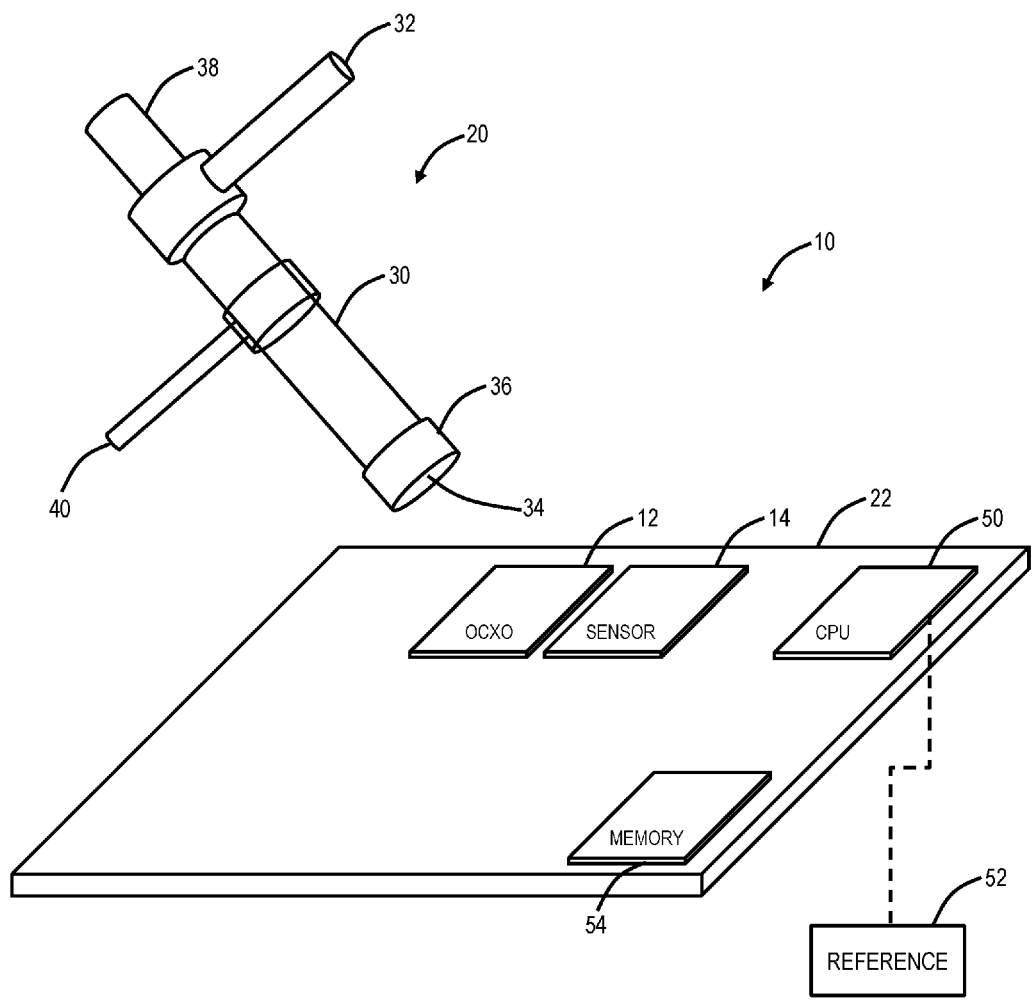
FIG. 1 is a block diagram illustrates an in-situ characterization system for determining temperature characteristics of an electronic component and an associated temperature sensor, using a vortex air gun.

Referring to FIG. 1, in an exemplary embodiment, a block diagram illustrates an in-situ characterization system 10 for determining temperature characteristics of an electronic device 12 and an associated temperature sensor 14, using a vortex air gun 20. The electronic device 12 and the temperature sensor 14 can be associated with a Printed Circuit Board (PCB) 22, a circuit pack, a circuit module, a blade, a line card, a pizza box (1 or 2 Rack Unit (RU) sized device), a pluggable module, or any other physical form factor. Again, the electronic device 12 is a device that is dependent on temperature with each different electronic component having its own temperature response. That is, the electronic device 12 on one PCB 22 has a different temperature response from another electronic device 12 on another PCB.

Figure 2:
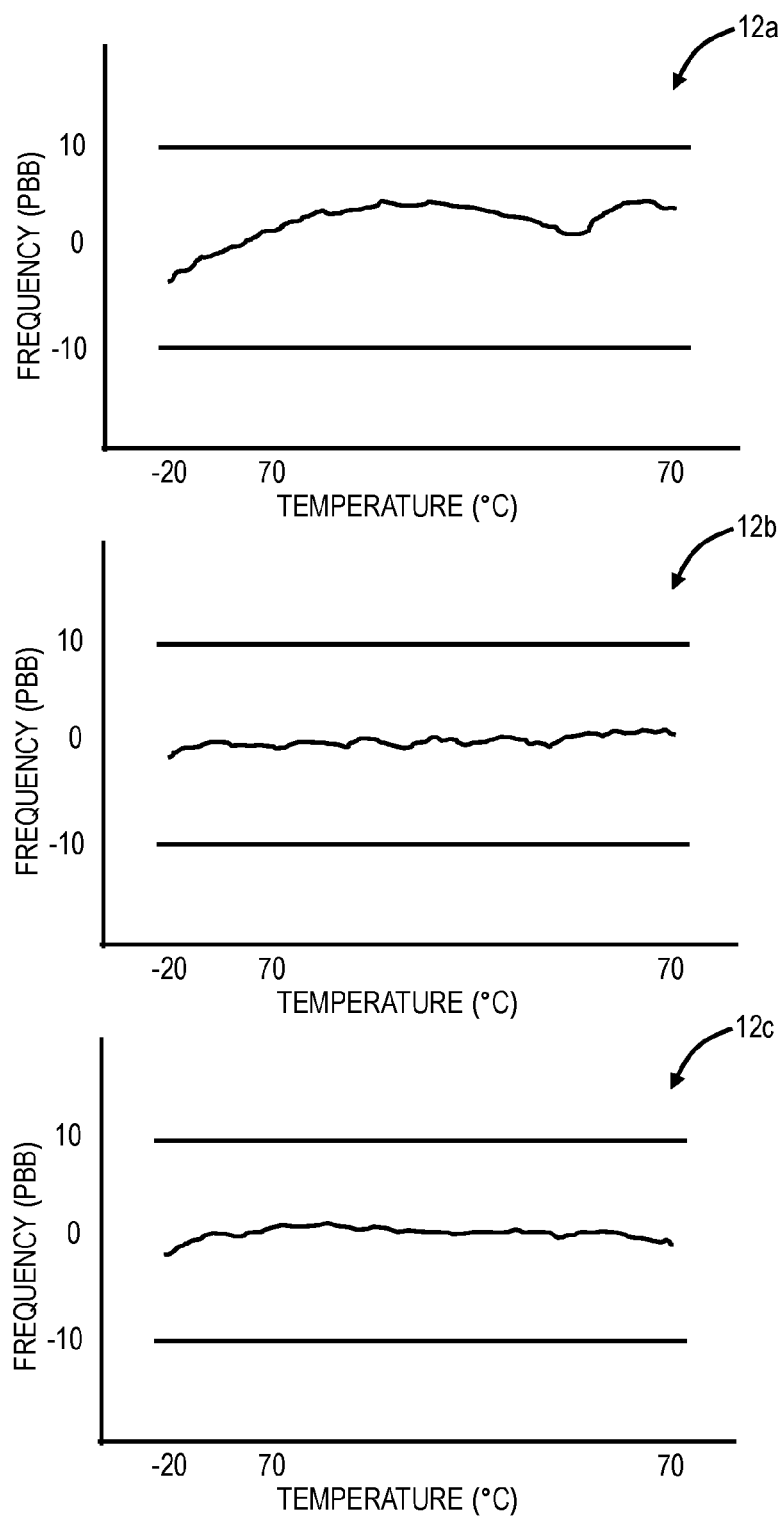
FIG. 2 is graphs of frequency error as a function of temperature for three different OCXOs, all from the same manufacturing batch.

Again, the electronic components 12 can include OCXOs, FPGAs, TCXOs, buffers, etc. For example, an OCXO can vary up to ±10 pbb (parts per billion) with temperature. Thus, in an OCXO, the temperature is the dominant form of frequency error. Referring to FIG. 2, in an exemplary embodiment, graphs illustrate frequency error as a function of temperature for three different OCXOs 12a, 12b, 12c all from the same manufacturing batch. Note, each of the OCXOs 12a, 12b, 12c, while providing the same functionality and having the same part number, has a unique temperature response. Also, as described above, each temperature sensor 14 for the associated OCXOs can also have its own unique response. Further, the PCB 22 itself, i.e., the direction of airflow, board temperature impedance, etc.) also affects temperature gradients, which can also impact the OCXO 12a, 12b, 12c response. Thus, it is important for accuracy to measure and calibrate the response in-situ for the OCXOs 12a, 12b, 12c, the associated temperature sensors 14 and the PCBs 22 together, for every device to provide unique compensation/calibration.

Figure 3:
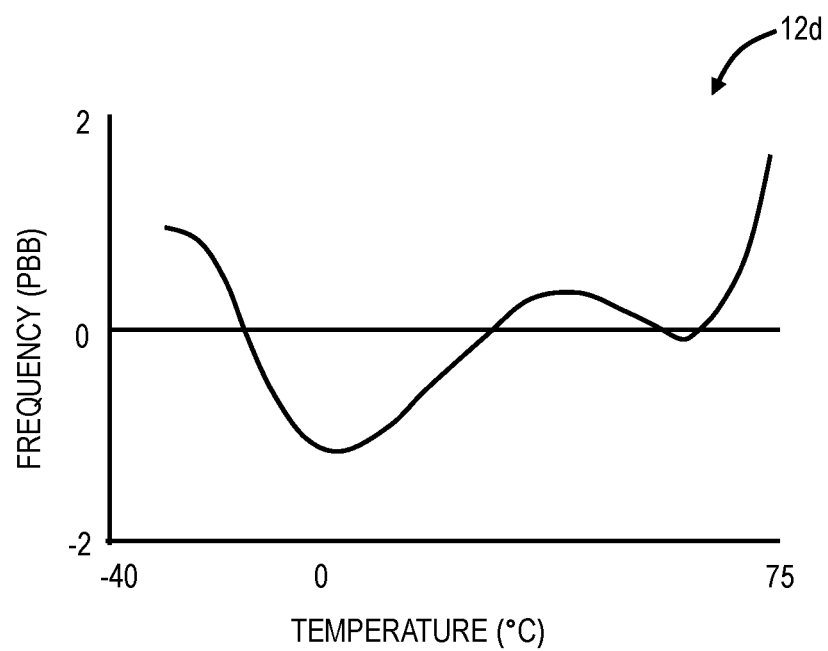
FIG. 3 is a graph of a temperature curve for an example Temperature Compensated Crystal Oscillator (TCXO)

The electronic device 12 can also be a TCXO. Referring to FIG. 3, in an exemplary embodiment, a graph illustrates a temperature curve for an example TCXO 12d. The TCXO 12d is temperature-compensated, but they still exhibit temperature variation because they are fundamentally inexpensive products (e.g., the cut of the crystal, no active temperature control, etc.).

The electronic device 12 can also be a line driver/buffer, an electronic clock buffer, etc. such as what might be used to drive the 1 pps (pulse per second) output on an Ethernet switch or the like. The delay through electronic clock buffers can easily vary by 10% over the temperature range.

Referring back to FIG. 1, the systems and methods compensate each device (i.e., the PCB 22) individually in-situ during manufacturing or after manufacturing while a device is deployed in the field. It is important to note that the temperature sensor 14 itself is part of what must be calibrated in the in-situ characterization system 10 as they can be off by ±1° C. and the offset is not necessarily fixed with temperature.

The systems and methods utilize the vortex air gun 20 which uses only compressed air to create an air stream of any temperature in the desired range (e.g., from −40° C. to +65° C. to cover an entire operating range of the PCB 22).

The vortex air gun 20 which can be directed at individual devices, PCBs 22, without putting the PCB 22 in a heat chamber, which is expensive and slow. The vortex air gun 20's airflow direction across the electronic device 12 (e.g., an OCXO) can be in the same direction and strength as normal product fan airflow (when the PCB 22 is deployed in a chassis, pizza box, shelf, etc.) This is important since OCXO temperature gradients can lead to different temperature responses as have confirmed based on lab testing. The temperature gradient is a physical quantity that describes in which direction and at what rate the temperature changes the most rapidly around a particular location. The temperature gradient is a dimensional quantity expressed in units of degrees (on a particular temperature scale) per unit length. Note, the vortex air gun 20 can adjust the temperature gradient as well as allow calibration based thereon, whereas a heat chamber cannot provide such characterization. The in-situ characterization system 10 can include a single vortex air gun 20 for creating a typical temperature gradient. In another exemplary embodiment, the in-situ characterization system 10 can include multiple vortex air guns 20 for creating a specific temperature gradient.

The vortex air gun 20 includes a vortex tube 30 which receives compressed air from an input 32. The vortex air gun 20 outputs hot air from an output 34, which can also include a control valve 36. The vortex air gun 20 can output cold air from an output 38 on an opposite side of the vortex tube 30 from the output 34. The vortex air gun 20 can also include a mechanical positioning mechanism 40 which can physically position the vortex air gun 20 relative to the PCB 22, the electronic device 12, and the temperature sensor 14.

The vortex air gun 20 uses compressed air as a power source, has no moving parts and produces hot air from the output 34 and cold air from the other output 38. The volume and temperature of these two airstreams are adjustable with the control valve 36 built into the hot air exhaust in the output 34. Temperatures as low as −50° F. (−46° C.) and as high as +260° F. (127° C.) are possible.

In an exemplary embodiment, the PCB 22 includes a processor 50 which can measure board temperature (based on communication to the temperature sensor 14) as well as provide feedback to the vortex air gun 20 for control thereof in stable increments across an entire operating range of the PCB 22 (e.g., from −40° C. to +65° C.). The processor 50 can operate pursuant to software instructions executing thereon. The software instructions can cause an on-board PLL to lock to a stable frequency reference 52 using servo software process. The stable frequency reference 52 can include an IEEE1588 grandmaster, Synchronous Ethernet (SyncE), GPS, etc. Assuming the electronic device 12 is an OCXO or the like, the servo software process can yield an FFO (Fractional Frequency Offset) error value that represents the difference between the local OCXO frequency and the stable frequency reference 52 reference frequency. A [FFO, temperature] two-tuple can be stored in a table across the full temperature range in specific increments, such as 1° C. The table can be stored in onboard such as in non-volatile memory 54 for each of the electronic devices 12 being calibrated (e.g., OCXO, TCXO, buffer/driver, etc.). Once out in the field, the PCB 22, the process 50, etc. can use the stored tables to compensate the OCXO frequency and buffer/driver delay at the current temperature. It can interpolate between table values as necessary. In order to compensate the buffer/driver delay, another two-tuple [phase delay, temperature] is required in the table.

Figure 4:
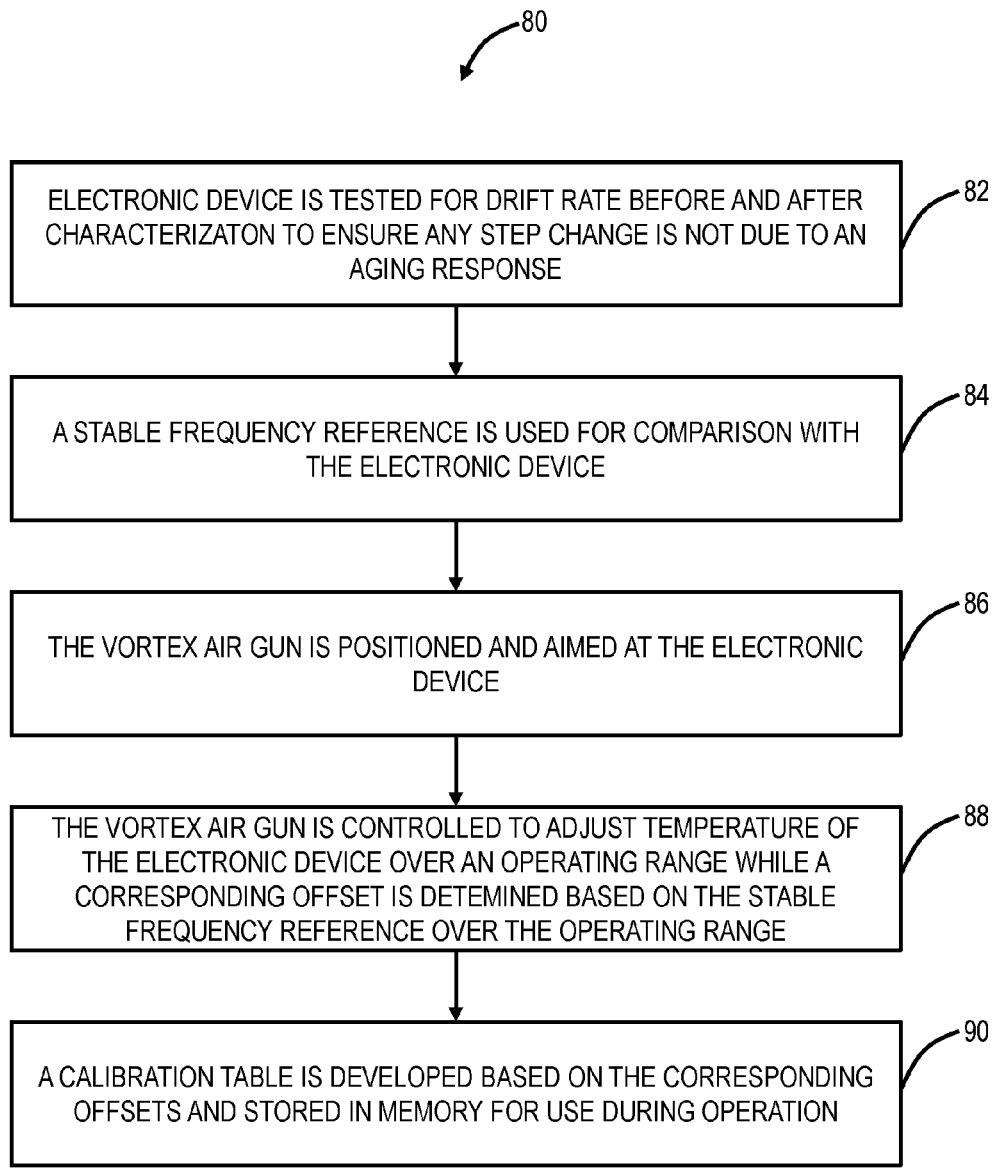
FIG. 4 is a flowchart of an in-situ temperature compensation process of the electronic device, the temperature sensor, and the PCB with the in-situ characterization system of FIG. 1.

Referring to FIG. 4, in an exemplary embodiment, a flowchart illustrates an in-situ temperature compensation process 80 of the electronic device 12, the temperature sensor 14, and the PCB 22, using the in-situ characterization system 10. The in-situ temperature compensation process 80 includes testing the electronic device for drift rate before and after characterization to ensure any step change is not due to an aging response (step 82). For example, the drift rate of the OCXO is measured before and after the tests in the in-situ temperature compensation process 80. If these measurements are substantially different, then the OCXO had a step change in its aging response during the in-situ temperature compensation process 80 and the in-situ temperature compensation process 80 must be re-run. Otherwise (if the in-situ temperature compensation process 80 is not re-run), the in-situ temperature compensation process 80 would incorrectly characterize an aging step change as a temperature-induced response.

A stable frequency reference 52 is used for comparison with the electronic device 12 (step 84). Specifically, the stable frequency reference 52 is communicatively coupled to a device performing/implementing the in-situ temperature compensation process 80, such as the processor 50. The stable frequency reference 52 is needed for comparison purposes, to determine an offset at each temperature. That is, the stable frequency reference 52 is used to develop the data in FIG. 2, for example. In particular, the stable frequency reference 52 is a comparable electronic device to the electronic device 12 that does not have variation over temperature (or a temperature variation and the temperature is held stable), such that the electronic device 12's variation can be determined, i.e., the FFO (Fractional Frequency Offset) error value that represents the difference between the local OCXO frequency and the stable frequency reference 52, at each temperature. In general, the comparable electronic device is a reference that must have minimal variation (e.g., drift, aging, temperature, noise, etc.) relative to the variations being compensated in the electronic device 12.

The vortex air gun 20 is positioned and aimed at the electronic device 12 (step 86). Here, the PCB 22 or the like can be positioned in a rack, test station, etc. and the vortex air gun 20 is positioned, such as via the mechanical positioning mechanism 40. Again, the in-situ temperature compensation process 80 is convenient and efficient, i.e., the in-situ temperature compensation process 80 does not require a heat chamber and the in-situ temperature compensation process 80 can provide temperature gradients similar to what is experienced in actual operation in the field, due to the airflow of the vortex air gun 20 which can be similar to airflow experienced by the PCB 22 in operation in a chassis, shelf, etc. For performing in-situ temperature compensation process 80 in the factory, the PCB 22 or the like is connected to a test station for data, power, communications to the vortex air gun 20, etc. Step 86 involves physical positioning of the PCB 22 so that the calibration can be performed. The vortex air gun 20 can be aimed at any device on the PCB 22. It can be aimed at any device whose delay is being calibrated (e.g., 1 pps output buffer, etc.) with respect to temperature. The vortex air gun 20 allows calibration of one device at a time. However, in an exemplary embodiment, the vortex air gun 20 can include multiple nozzles (e.g., outputs 34, 38) which can be used to direct air to different locations on the PCB 22.

The vortex air gun 20 is controlled to adjust the temperature of the electronic device 12 over an operating range and a corresponding offset is determined over the operating range based on the stable frequency reference 52 (step 88). Specifically, the vortex air gun 20 changes the temperature of the electronic device 12 and the temperature sensor 14. The temperature sensor 14 is adapted to determine a current temperature, based on the output from the vortex air gun 20. At this particular temperature, the corresponding offset can be determined (e.g., the FFO (Fractional Frequency Offset) error value that represents the difference between the local OCXO frequency and the stable frequency reference 52). The processor 50 can be configured to cause the vortex air gun 20 to vary the temperature of the electronic device 12 and the temperature sensor 14 over the operating range. The corresponding offset can be determined at a certain interval, e.g., every degree, every N degrees where N is an integer or real number, and the like. In an exemplary embodiment, an exponential smoothing function can be applied to the compensation values to reduce effects of noise associated with the temperature sensor 14. The exponential smoothing function is chosen for its smoothing effect without introducing excessive delay.

Finally, a calibration table is developed based on the corresponding offsets and stored in memory 54 for use during actual operation in the field (step 90). The calibration table allows the processor 50 or the like to provide a correction value for operation in the field at a given temperature. Referring to FIG. 2, the calibration table can be used to flatten the graphs for the OCXOs 12a, 12b, 12c such that the frequency pbb is 0 across the entire operating range.

The in-situ temperature compensation process 80 can be used to determine calibration for any electronic device 12 whose performance is variable with respect to temperature and whose performance (or error) can be determined at each temperature value, such as based on a comparison to the stable frequency reference 52. The stable frequency reference 52 is a value of how the electronic device 12 should operate without variance. For an OCXO, TCXO, etc., the stable frequency reference 52 can be a timing reference.

For manufacturing, a key aspect is the speed of the in-situ temperature compensation process 80 and time taken per PCB 22. The in-situ temperature compensation process 80 can be quite fast since it is a low-mass system (compared to conventional techniques which put the whole PCB 22 in a large, slow temperature chamber), which is also impractical for large boards.

Figure 5:
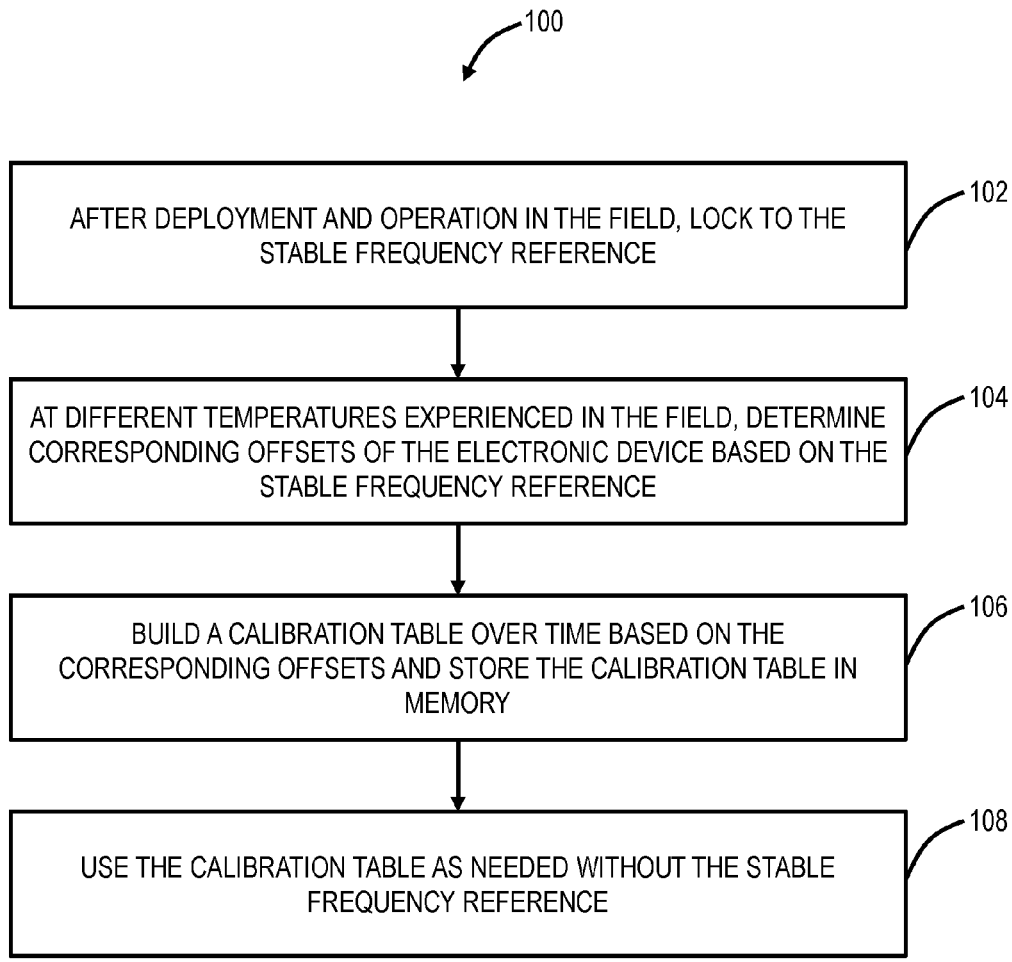
FIG. 5 is a flowchart of an in-situ temperature compensation process of the electronic device, the temperature sensor, and the PCB, performed in the field, during operation.

Referring to FIG. 5, in an exemplary embodiment, a flowchart illustrates an in-situ temperature compensation process 100 of the electronic device 12, the temperature sensor 14, and the PCB 22, performed in the field, during operation. Similar to temperature compensation during manufacturing using the in-situ temperature compensation process 80, the temperature may be compensated when a device is deployed in the field using the in-situ temperature compensation process 100. The electronic device 12 can essentially adapt to its environment. Note that this compensation in the in-situ temperature compensation process 100 is only possible for OCXO output, with the stable frequency reference 52, and not buffer delay compensation.

After deployment and operation in the field, an electronic device 12 can be locked to a stable frequency reference 52 (step 102). The stable frequency reference 52 can be a master clock reference (e.g., grandmaster, SyncE, GPS, etc.). The electronic device 12 can also take board temperature readings, via the temperature sensor 14. If the electronic device 12 is in a low noise environment (which would be the case for SyncE and GPS references) a FFO, temperature two-tuppe table can be built and stored in non-volatile memory. Specifically, at different temperatures experienced in the field, the corresponding offset can be determined by the electronic device 12, based on the stable frequency reference 52 (step 104). A calibration table can be built over time, based on the corresponding offsets and the calibration table can be stored in memory (step 106). The calibration table can be used as needed such as without the stable frequency reference 52 (step 108).

The in-situ temperature compensation process 100 could be useful for current industry trends where deployments are trending toward GPS assisted deployments. Devices are designed to lock to GPS inputs (i.e., the stable frequency reference 52), with IEEE1588v2 inputs (e.g., OCXOs 12a, 12b, 12c) as a backup. Temperature compensation tables (the calibration table) can be built while locked to the GPS inputs and used to compensate if GPS lock is lost and the device switches to IEEE1588v2 inputs. The systems and methods can also work with GPS only with no IEEE1588 backup. The calibration table can be built while the GPS is operation, and if the GPS fails, the calibration table can be used to maintain a stable clock holdover that is not sensitive to temperature variation.

If the electronic device 12 is deployed and locked to a grandmaster (e.g., IEEE1588v2) reference, a temperature compensation table can still be built. In this case, the 1588v2 software servo process would monitor the reference clock and only build the two-tuple table in a low Packet Delay Variation (PDV) noise case. This ensures that the table accurately corrects for temperature.

Again, the processor 50 can send commands to the vortex air gun 20 for a particular temperature and airflow set point. The processor 50 on the PCB 22 polls the temperature sensor 14 near the OCXO 12a, 12b, 12c until the temperature stabilizes. The servo software process also locks the onboard PLL to the stable frequency reference 52. Once locked, the servo software process provides the error value and the processor 50 stores this value along with the current temperature into a non-volatile table, in the memory 54. The processor 50 then proceeds to the next temperature and repeats until the full temperature range is spanned.

The processor 50 can detect when the temperature reading stabilizes by taking multiple readings. This allows it to move on to the next reading more quickly, dependent on the mass of the electronic device 12 being heated/cooled and the properties of the vortex air gun 12 (air flow rate, reaction time to new temperature setting, etc.). If the electronic device 12 is not calibrated in the factory, the same process is applicable in the field (with or without the vortex air gun 20). The electronic device 12 will monitor temperature and build the table while it is locked to a low noise input reference.

Figure 6:
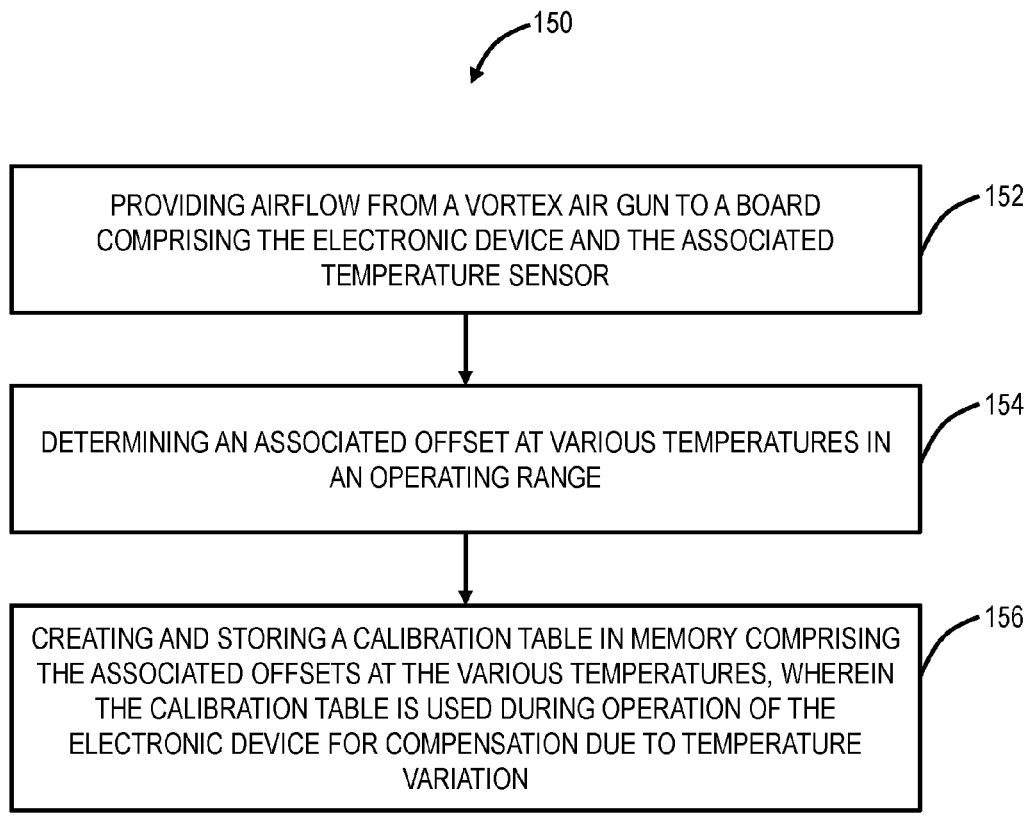
FIG. 6 is a flowchart of another in-situ temperature compensation process of an electronic device and an associated temperature sensor.

Referring to FIG. 6, in an exemplary embodiment, a flowchart illustrates an in-situ temperature compensation process 150 of an electronic device 12 and an associated temperature sensor 14. The in-situ temperature compensation process 150 includes providing airflow from a vortex air gun 20 to a board 22 including the electronic device 12 and the associated temperature sensor 14 (step 152); determining an associated offset at various temperatures in an operating range (step 154); and creating and storing a calibration table in memory 54 including the associated offsets at the various temperatures, wherein the calibration table is used during operation of the electronic device 12 for compensation due to temperature variation (step 156). The airflow from the vortex air gun 20 is controlled to cause temperatures to the electronic device over the operating range. The airflow is provided in a similar manner as airflow cooling the board 22 during operation thereby matching temperature gradients experienced during the operation. The associated offset is measured with reference to a stable frequency reference 52, and the various temperatures are measured by the associated temperature sensor 14.

The associated offset is measured with reference to a stable frequency reference 52, and the various temperatures are measured by the associated temperature sensor 14, and wherein the calibration table includes a two-tuple of [offset, temperature] for every N degrees in the operating range, wherein N is an integer or real number. The electronic device 12 can include one of an Oven-Controlled Crystal Oscillator (OCXO) and a Temperature Compensated Crystal Oscillator (TCXO), wherein the associated offset is measured with reference to a stable frequency reference 52 can include one of an IEEE1588v2 grandmaster, Synchronous Ethernet (SyncE), and Global Positioning System (GPS) signal. The electronic device 12 can include one a Field Programmable Gate Array (FPGA), a buffer, and a driver. The determining, the creating, and the storing steps are performed by a processor 50 communicatively coupled to and controlling the vortex air gun 20.

In another exemplary embodiment, the in-situ temperature compensation system 10 for an electronic device 12 and an associated temperature sensor 14 includes a vortex air gun 2-mechanically positioned over a board 22 and adapted to provide airflow over the board 22 at a plurality of temperatures over an operating range; a processor 50 communicatively coupled to the vortex air gun 20; and memory 54 storing instructions that, when executed, cause the processor 50 to cause airflow from the vortex air gun 20 to the board 22, the electronic device 12, and the associated temperature sensor 14, determine an associated offset at various temperatures in an operating range, and create and store a calibration table in memory 54 including the associated offsets at the various temperatures, wherein the calibration table is used during operation of the electronic device 12 for compensation due to temperature variation.

In a further exemplary embodiment, an electronic system includes an electronic device 12 compensated by an in-situ temperature compensation system 10. The electronic system includes a board 22, wherein the electronic device 12 is disposed to the board 22; a temperature sensor 14 disposed to the board 22; a processor 50 disposed to the board 22 and communicatively coupled to the electronic device 12 and the temperature sensor 14; and memory 54 storing instructions that, when executed, cause the processor 50 to determine an associated offset at various temperatures in an operating range, and create and store a calibration table in memory 54 including the associated offsets at the various temperatures, wherein the calibration table is used during operation of the electronic device for compensation due to temperature variation.

It will be appreciated that some exemplary embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the exemplary embodiments described herein, a corresponding device such as hardware, software, firmware, and a combination thereof can be referred to as "circuitry configured or adapted to," "logic configured or adapted to," etc. perform a set of operations, steps, methods, processes, algorithms, functions, techniques, etc. as described herein for the various exemplary embodiments.

Moreover, some exemplary embodiments may include a non-transitory computer-readable storage medium having computer readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various exemplary embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. An in-situ temperature compensation method of an electronic device and an associated temperature sensor, the in-situ temperature compensation method comprising:
providing airflow from a vortex air gun to a board comprising the electronic device and the associated temperature sensor;
determining an associated offset at various temperatures in an operating range; and
creating and storing a calibration table in memory comprising the associated offsets at the various temperatures, wherein the calibration table is used during operation of the electronic device for compensation due to temperature variation;

wherein the associated offset is measured with reference to a stable frequency reference and the various temperatures are measured by the associated temperature sensor, and wherein the calibration table comprises a two-tuple of [offset, temperature] for every N degrees in the operating range, wherein N is an integer or real number.

2. The in-situ temperature compensation method of claim 1, wherein the airflow from the vortex air gun is controlled to cause temperatures to the electronic device over the operating range.

3. The in-situ temperature compensation method of claim 1, wherein the airflow is provided in a similar manner as airflow cooling the board during operation thereby matching temperature gradients experienced during the operation.

4. The in-situ temperature compensation method of claim 1, wherein the associated offset is measured with reference to a stable frequency reference and the various temperatures are measured by the associated temperature sensor.

5. The in-situ temperature compensation method of claim 1, wherein the electronic device comprises one of an Oven-Controlled Crystal Oscillator (OCXO) and a Temperature Compensated Crystal Oscillator (TCXO), wherein the associated offset is measured with reference to a stable frequency reference comprises one of an IEEE1588v2 grandmaster, Synchronous Ethernet (SyncE), and Global Positioning System (GPS) signal.

6. The in-situ temperature compensation method of claim 1, wherein the electronic device comprises one a Field Programmable Gate Array (FPGA), a buffer, and a driver.

7. The in-situ temperature compensation method of claim 1, wherein the determining, the creating, and the storing steps are performed by a processor communicatively coupled to and controlling the vortex air gun.

8. An in-situ temperature compensation system for an electronic device and an associated temperature sensor, the in-situ temperature compensation system comprising:
 a vortex air gun mechanically positioned over a board and adapted to provide airflow over the board at a plurality of temperatures over an operating range;
 a processor communicatively coupled to the vortex air gun; and
 memory storing instructions that, when executed, cause the processor to
  cause airflow from the vortex air gun to the board, the electronic device, and the associated temperature sensor,
  determine an associated offset at various temperatures in an operating range, and
  create and store a calibration table in memory comprising the associated offsets at the various temperatures, wherein the calibration table is used during operation of the electronic device for compensation due to temperature variation,
  wherein the associated offset is measured with reference to a stable frequency reference, and the various temperatures are measured by the associated temperature sensor, and wherein the calibration table comprises a two-tuple of [offset, temperature] for every N degrees in the operating range, wherein N is an integer or real number.

9. The in-situ temperature compensation system of claim 8, wherein the airflow from the vortex air gun is controlled to cause temperatures to the electronic device over the operating range.

10. The in-situ temperature compensation system of claim 8, wherein the airflow is provided in a similar manner as airflow cooling the board during operation thereby matching temperature gradients experienced during the operation.

11. The in-situ temperature compensation system of claim 8, wherein the associated offset is measured with reference to a stable frequency reference, and the various temperatures are measured by the associated temperature sensor.

12. The in-situ temperature compensation system of claim 8, wherein the electronic device comprises one of an Oven-Controlled Crystal Oscillator (OCXO) and a Temperature Compensated Crystal Oscillator (TCXO), wherein the associated offset is measured with reference to a stable frequency reference comprises one of an IEEE1588v2 grandmaster, Synchronous Ethernet (SyncE), and Global Positioning System (GPS) signal.

13. The in-situ temperature compensation system of claim 8, wherein the electronic device comprises one a Field Programmable Gate Array (FPGA), a buffer, and a driver.

14. An electronic system comprising an electronic device compensated by an in-situ temperature compensation system, the electronic system comprising:
 a board, wherein the electronic device is disposed on the board;
 a temperature sensor disposed on the board;
 a processor disposed on the board and communicatively coupled to the electronic device and the temperature sensor; and
 memory storing instructions that, when executed, cause the processor to
  determine an associated offset at various temperatures in an operating range, and
  create and store a calibration table in memory comprising the associated offsets at the various temperatures, wherein the calibration table is used during operation of the electronic device for compensation due to temperature variation,
  wherein the associated offset is measured with reference to a stable frequency reference, and the various temperatures are measured by the associated temperature sensor, and wherein the calibration table comprises a two-tuple of [offset, temperature] for every N degrees in the operating range, wherein N is an integer or real number.

15. The electronic system of claim 14, wherein the memory storing instructions that, when executed, further cause the processor to
 cause airflow from a vortex air gun to the board, the electronic device, and the temperature sensor to cause the various temperatures in the operating range.

16. The electronic system of claim 14, wherein the associated offset is measured with reference to a stable frequency reference, and the various temperatures are measured by the associated temperature sensor.

17. The electronic system of claim 14, wherein the electronic device comprises one of
 i) one of an Oven-Controlled Crystal Oscillator (OCXO) and a Temperature Compensated Crystal Oscillator (TCXO), wherein the associated offset is measured with reference to a stable frequency reference comprises one of an IEEE1588v2 grandmaster, Synchronous Ethernet (SyncE), and Global Positioning System (GPS) signal; and
 ii) one a Field Programmable Gate Array (FPGA), a buffer, and a driver.

* * * * *